(12) United States Patent
Smith et al.

(10) Patent No.: US 7,642,842 B1
(45) Date of Patent: Jan. 5, 2010

(54) SYSTEM AND METHOD FOR PROVIDING COMMUNICATION OF OVER-CURRENT PROTECTION AND CURRENT MODE CONTROL BETWEEN MULTIPLE CHIPS IN AN INTEGRATED CIRCUIT

(75) Inventors: Gregory J. Smith, Tucson, AZ (US); Paul Ranucci, Tucson, AZ (US); Glenn C. Dunlap, III, Tucson, AZ (US); David Megaw, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 96 days.

(21) Appl. No.: 11/356,708

(22) Filed: Feb. 17, 2006

(51) Int. Cl.
*G05F 1/10* (2006.01)
*G05F 3/02* (2006.01)

(52) U.S. Cl. .................. 327/543; 327/18; 327/20; 327/108; 327/315; 361/90

(58) Field of Classification Search ............ 327/18, 327/108, 315, 543
See application file for complete search history.

(56) References Cited

U.S. PATENT DOCUMENTS

| | | | |
|---|---|---|---|
| 5,585,763 A * | 12/1996 | Navabi et al. ............ 330/255 |
| 5,973,569 A | 10/1999 | Nguyen | |
| 6,011,414 A | 1/2000 | Majid et al. | |
| 6,185,082 B1 * | 2/2001 | Yang ...................... 361/90 |
| 6,323,703 B1 * | 11/2001 | Fotouhi ................... 327/112 |
| 6,452,766 B1 | 9/2002 | Carper | |
| 6,621,336 B1 | 9/2003 | Johnson | |
| 6,624,994 B1 | 9/2003 | Schmoock et al. | |
| 6,781,354 B2 | 8/2004 | Zhang | |
| 6,801,058 B1 * | 10/2004 | Jiandong .................. 327/20 |
| 6,891,739 B2 | 5/2005 | Nadd et al. | |
| 2004/0259288 A1 * | 12/2004 | Mostafazadeh et al. ..... 438/106 |
| 2005/0035746 A1 * | 2/2005 | Bernacchia et al. ........ 323/282 |
| 2005/0052223 A1 * | 3/2005 | Sakhuja et al. ............ 327/543 |

* cited by examiner

*Primary Examiner*—Lincoln Donovan
*Assistant Examiner*—John W Poos

(57) ABSTRACT

A system and method is disclosed for providing communication of an over-current protection signal and current mode control signals between a controller chip and a power chip in an integrated circuit device that comprises a plurality of integrated circuit chips. The controller chip sends pulse width modulation signals and a reference current signal to the power chip. Current flow status detection circuitry in the power chip detects a current flow status in the power chip and provides a current flow status signal to the controller chip. The current flow status signal may comprise an over-current protection signal or current mode control signals. One advantageous embodiment of the invention comprises a switch mode power supply integrated circuit.

20 Claims, 3 Drawing Sheets

SYSTEM AND METHOD FOR PROVIDING COMMUNICATION OF OVER-CURRENT PROTECTION AND CURRENT MODE CONTROL BETWEEN MULTIPLE CHIPS IN AN INTEGRATED CIRCUIT

TECHNICAL FIELD OF THE INVENTION

The present invention is generally directed to integrated circuit devices and, in particular, to a system and method for providing communication of over-current protection and current mode control between multiple chips in an integrated circuit.

BACKGROUND OF THE INVENTION

Mixing diverse integrated circuit (IC) technologies in a single integrated circuit package may provide several positive results. The strength of each separate integrated circuit technology can be advantageously applied to a specified segment of an overall system.

For example, consider the application of this principle to the case of a switch mode power supply integrated circuit (IC). The controller block of a switch mode power supply may benefit from the utilization of a wafer process that provides high accuracy and high gain bipolar junction transistors. Greater precision and speed for the amplifiers and voltage references are possible. Such a wafer process would also possess methods for trimming analog accuracy or selecting functional options for the operation of the system. The controller block of the switch mode power supply does not require high voltage or power transistors. Therefore, the controller block could utilize a high density technology than would be obtainable in a monolithic design.

Now consider the power stages of the switch mode power supply. The power stages would benefit from the utilization of a wafer process that optimizes the functions that are performed by the power stages. The power stages of a switch mode power supply typically require high voltage and current handling. The minimum amount of sensitive signal control circuitry would be placed on the power chip in order to avoid interference from the extremely noisy environment that is created by the power switches.

However, there are several functions that must reside (at least in part) on the power chip. One such function comprises the provision of over-current protection. The power chip must comprise current sensing circuits for providing over-current protection. Another such function is the provision of current mode control. The power chip must comprise sensing circuits for performing current mode control methods.

There is a need in the art for a system and method that is capable of providing efficient communication of over-current protection between multiple chips in an integrated circuit. There is also a need in the art for a system and method that is capable of providing efficient communication of current mode control between multiple chips in an integrated circuit. In particular, there is a need in the art for a system and method that is capable of providing efficient communication of over-current protection and current mode control between multiple chips in a switch mode power supply integrated circuit.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

In particular, exemplary embodiments of the present invention will be described in a switch mode power supply circuit. It is understood that the present invention is not limited to use in a switch mode power supply circuit and that the principles of the present invention can also be employed in other types of devices.

Figure 1:
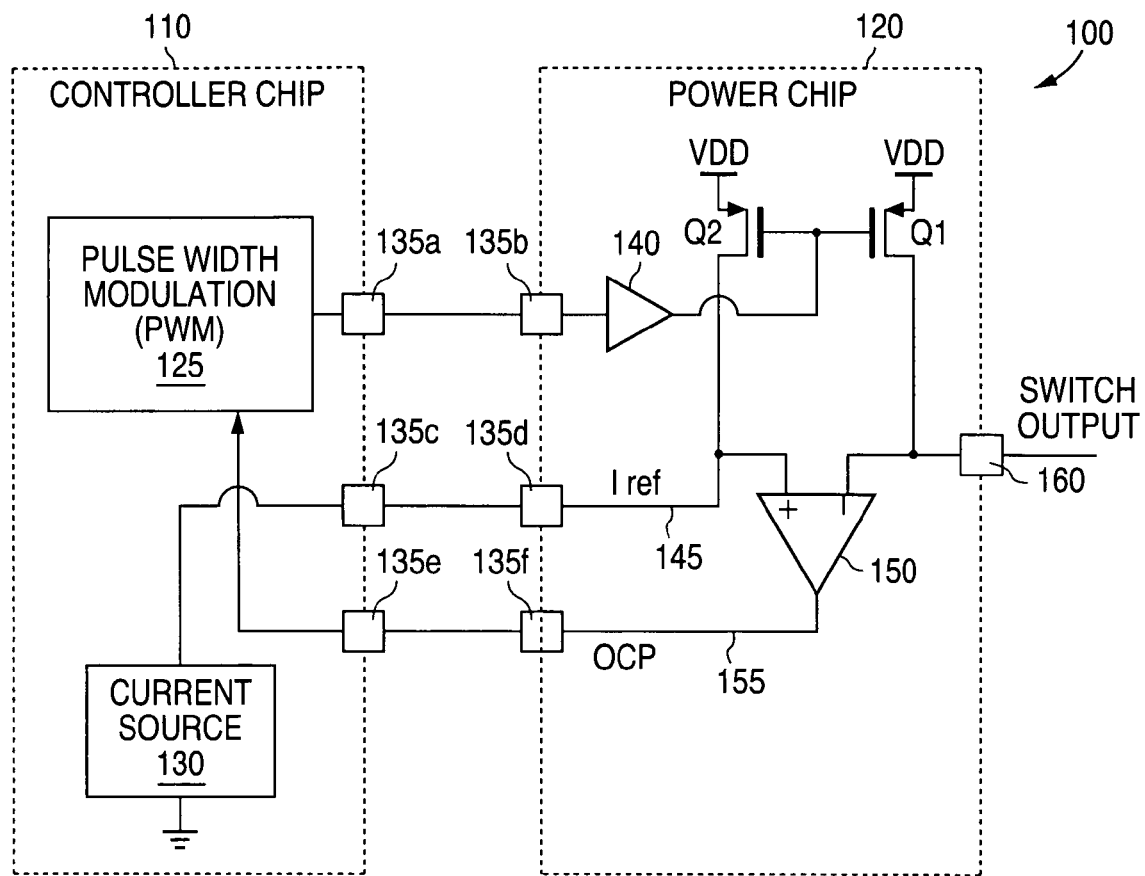
FIG. 1 illustrates a schematic circuit diagram of a first advantageous embodiment of the present invention.

FIG. 1 illustrates a schematic circuit diagram of a portion of a switch mode power supply circuit 100 that comprises a first advantageous embodiment of the present invention. The portion of the switch mode power supply circuit 100 that is shown in FIG. 1 comprises a controller chip 110 and a power chip 120. Controller chip 110 comprises a first integrated circuit 110 and power chip 120 comprises a second integrated circuit 120. As will be more fully described, the two integrated circuits (110 and 120) are coupled together by signals lines and are capable of communicating data and control signals over the signal lines.

As shown in FIG. 1, controller chip 110 comprises a pulse width modulation (PWM) module 125 and a current source 130. The pulse width modulation (PWM) module 125 sends a pulse width modulation signal to the power chip 120 through a signal line that exits controller chip 110 at node 135a and enters power chip 120 at node 135b. The signal at node 135b is provided to an input of amplifier 140 in power chip 120.

Power chip 120 comprises transistor Q1 and transistor Q2. Transistor Q1 comprises a "power" transistor having a source connected to the integrated circuit power supply "vdd" and a drain connected to the power switch output node 160 of power chip 120. Transistor Q2 comprises a "sense" transistor having a source connected to the integrated circuit power supply "vdd" and a drain connected to the current source 130 of controller chip 110 through a reference current signal line 145 designated "I ref." The reference current signal line 145 exits power chip 120 at node 135d and enters controller chip 110 at node 135c. Node 135c is connected to an output of current source 130 in controller chip 110. Current source 130 provides a reference current for the sense transistor Q2 on reference current signal line 145.

The gate of transistor Q1 and the gate of transistor Q2 are also connected. The output of amplifier 140 is connected to the signal line that connects the gate of transistor Q1 and the gate of transistor Q2.

In an advantageous embodiment of the invention the sense transistor Q2 is a scaled down version of the power resistor Q1. In this advantageous embodiment the reference current Iref is a scaled down version of the output current.

As shown in FIG. 1, the power chip 120 also comprises an "over-current" comparator 150. The positive input of comparator 150 is connected to the reference current signal line 145. The negative input of comparator 150 is connected to the power switch output node 160 of power chip 120. Comparator 150 compares the current in the reference current signal line 145 and the current from the power transistor Q1. The comparison of the two currents in comparator 150 allows comparator 150 to determine when the current from the power transistor Q1 exceeds the reference current times the ratio of Ron(Q1)/Ron(Q2). The term Ron refers to the effective resistance of a transistor when the transistor is in an "on" state.

Comparator 150 outputs a digital signal on "over-current protection" (OCP) signal line 155. Signal line 155 exits power chip 120 at node 135f and enters controller chip 110 at node 135e. Node 135e is connected to an input of pulse width modulation (PWM) module 125 in controller chip 110. The signal from comparator 150 conveys information concerning the status of the current that is output at switch node 160. Depending on the value of the signal that is present on the "over-current protection" (OCP) signal line 155, the pulse width modulation (PWM) module 125 modifies the control signal that is provided to amplifier 140 and ultimately to the gate of transistor Q1 and to the gate of transistor Q2.

The best results for communicating the "over-current protection" signal from power chip 120 to controller chip 110 were obtained when (1) the comparator 150 was placed within the power chip 120, and (2) the comparator 150 generated and sent a digital signal to the pulse width modulation (PWM) module 125 of the controller chip 110 when an "over-current" condition occurred.

It was determined that an optimal arrangement is one that provides a low temperature reference current on the controller chip 110 (using current source 130) and that sends the reference current to the current sense circuitry (i.e., transistor Q2) of the power chip 120. This approach allows the controller chip 110 to determine the actual threshold (by trimming methods). This approach also alleviates the supply, noise and temperature dependencies in the power chip 120.

The approach of the present invention provides a high level of accuracy over the full range of operating conditions. The present invention also uses two lines of noise immune communication (i.e., the reference current signal line 145 and the digital "over-current protection" (OCP) signal line 155). The present invention achieves these results by separately applying the strengths of each technology to the tasks that each technology is best suited to accomplish. The controller chip 110 provides pulse width modulated (PWM) control signals to the power chip 120. The power chip 120 in turn provides control signals that are related to the current flow in the power chip 120 to the pulse width modulated (PWM) module 125 in the controller chip 110.

The "over-current" comparator 150 in power chip 120 is an embodiment of a current flow status detection circuit that detects the presence of an "over-current" condition in power chip 120.

Figure 2:
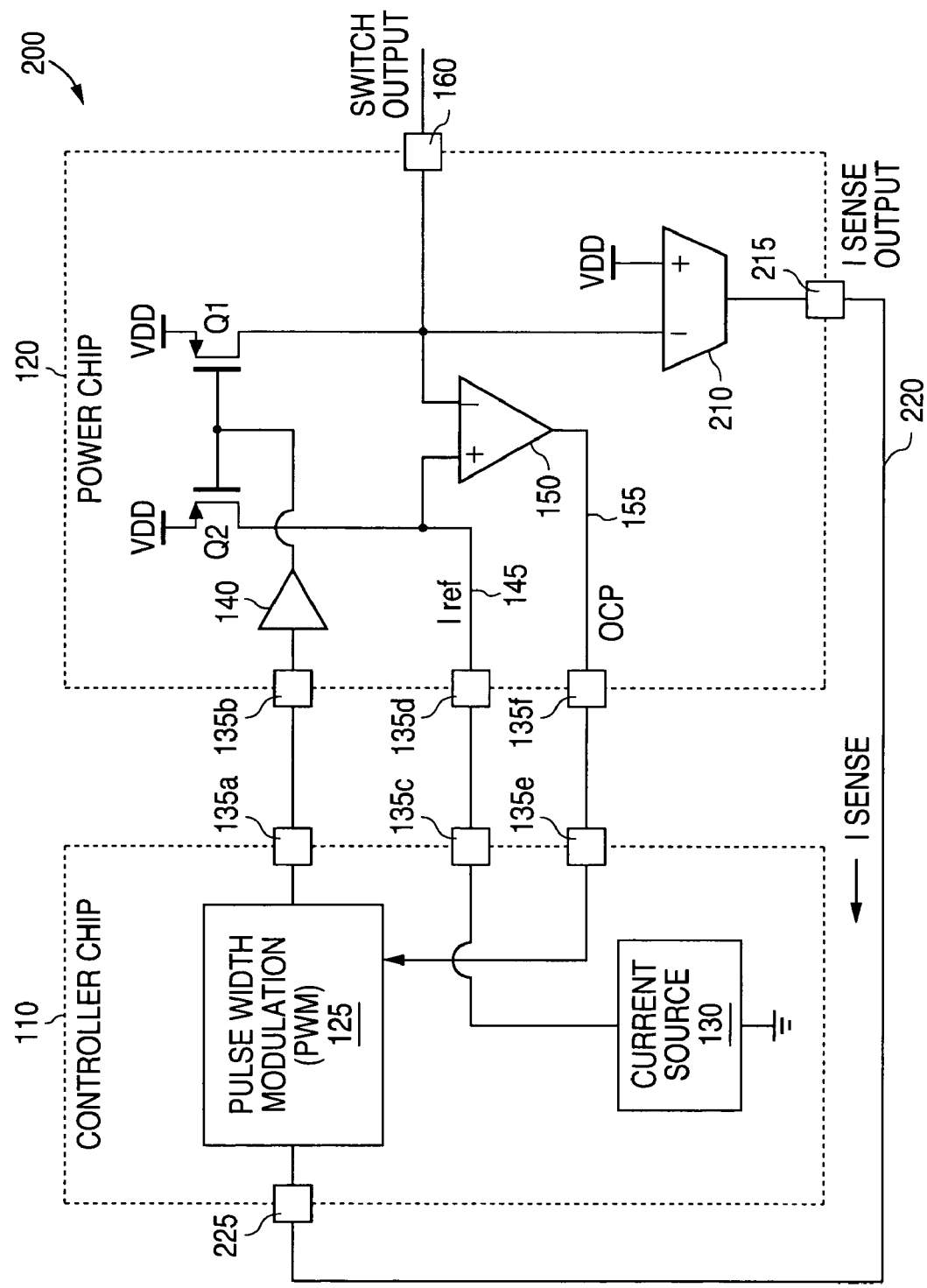
FIG. 2 illustrates a schematic circuit diagram of a second advantageous embodiment of the present invention.

FIG. 2 illustrates a schematic circuit diagram of a portion of a switch mode power supply circuit 200 that comprises a second advantageous embodiment of the present invention. The schematic circuit diagram shown in FIG. 2 comprises the portion of the switch mode power supply circuit shown in FIG. 1 plus additional elements. The additional elements provide communication between the controller chip 110 and the power chip 120 for the linear current sensing that is needed to implement current mode control methods.

As shown in FIG. 2, an operational transconductance amplifier circuit 210 is provided in power chip 120. A non-inverting input of the operational transconductance amplifier circuit 210 is coupled to the integrated circuit power supply "vdd". An inverting input of the operational transconductance amplifier circuit 210 is coupled to the drain of the power transistor Q1 and to the switch output node 160. The output of the operational transconductance amplifier circuit 210 is coupled to an "I sense" output node 215 of the power circuit 120.

A first end of an "I sense" signal line 220 is coupled to the "I sense" output node 215 of the power chip 120. A second end of the "I sense" signal line 220 is coupled to an input node 225 of the controller chip 110. The "I sense" signal line 220 sends a signal from the power chip 120 to the controller chip 110 that is a scaled replica of the output current at the switch output node 160 of the power chip 120.

The operational transconductance amplifier circuit 210 in power chip 120 is an embodiment of a current flow status detection circuit that provides a scaled replica of the output current at the switch output node 160 of the power chip 120.

Figure 3A:
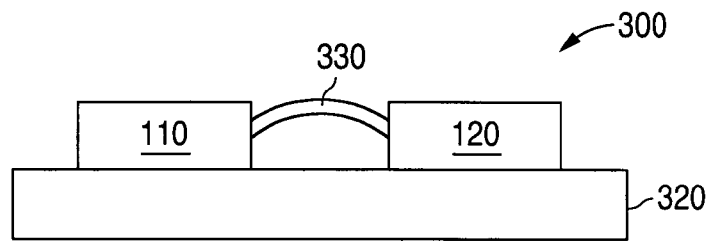
FIG. 3A illustrates a diagram showing a lateral placement of a controller chip and a power chip on a die attach pad of an integrated circuit of the present invention.

FIG. 3A illustrates a diagram 300 showing a lateral placement of a controller chip 110 and a power chip 120 on a die attach pad 320 of an integrated circuit of the present invention. As shown in FIG. 3A, the controller chip 110 is located on the die attach pad 320 and the power chip 120 is located on the die attach pad 320. The signal line connections between the controller chip 110 and the power chip 120 are illustrated symbolically as connector 330. In this advantageous embodiment the controller chip 110 and the power chip 120 are located laterally on the die attach pad 320 with respect to each other.

Figure 3B:
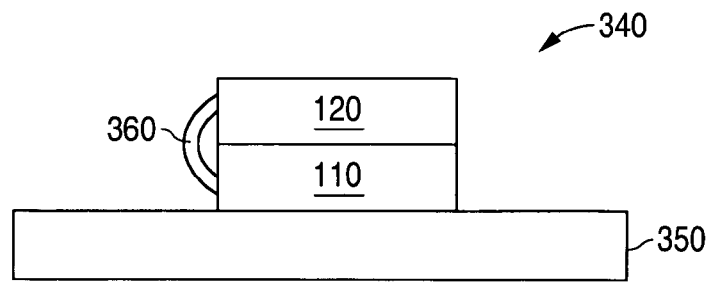
FIG. 3B illustrates a diagram showing a vertical placement of a controller chip and a power chip on a die attach pad of an integrated circuit of the present invention.

FIG. 3B illustrates a diagram 340 showing a vertical placement of a controller chip 110 and a power chip 120 on a die attach pad 350 of an integrated circuit of the present invention. As shown in FIG. 3B, the controller chip 110 is located on the die attach pad 320 and the power chip 120 is located on top of the controller chip 110. The signal line connections between the controller chip 110 and the power chip 120 are illustrated symbolically as connector 360. In this advantageous embodiment the controller chip 110 and the power chip 120 are located vertically with respect to each other. This advantageous embodiment features a reduced amount of contact area on the die attach pad 350.

Although FIG. 3B shows the controller chip 110 on the bottom and the power chip 120 on top, it is understood that the positions of the controller chip 110 and the power chip 120 could be reversed. That is, the power chip 120 could be on the bottom and the controller chip 110 could be on top.

Figure 4:
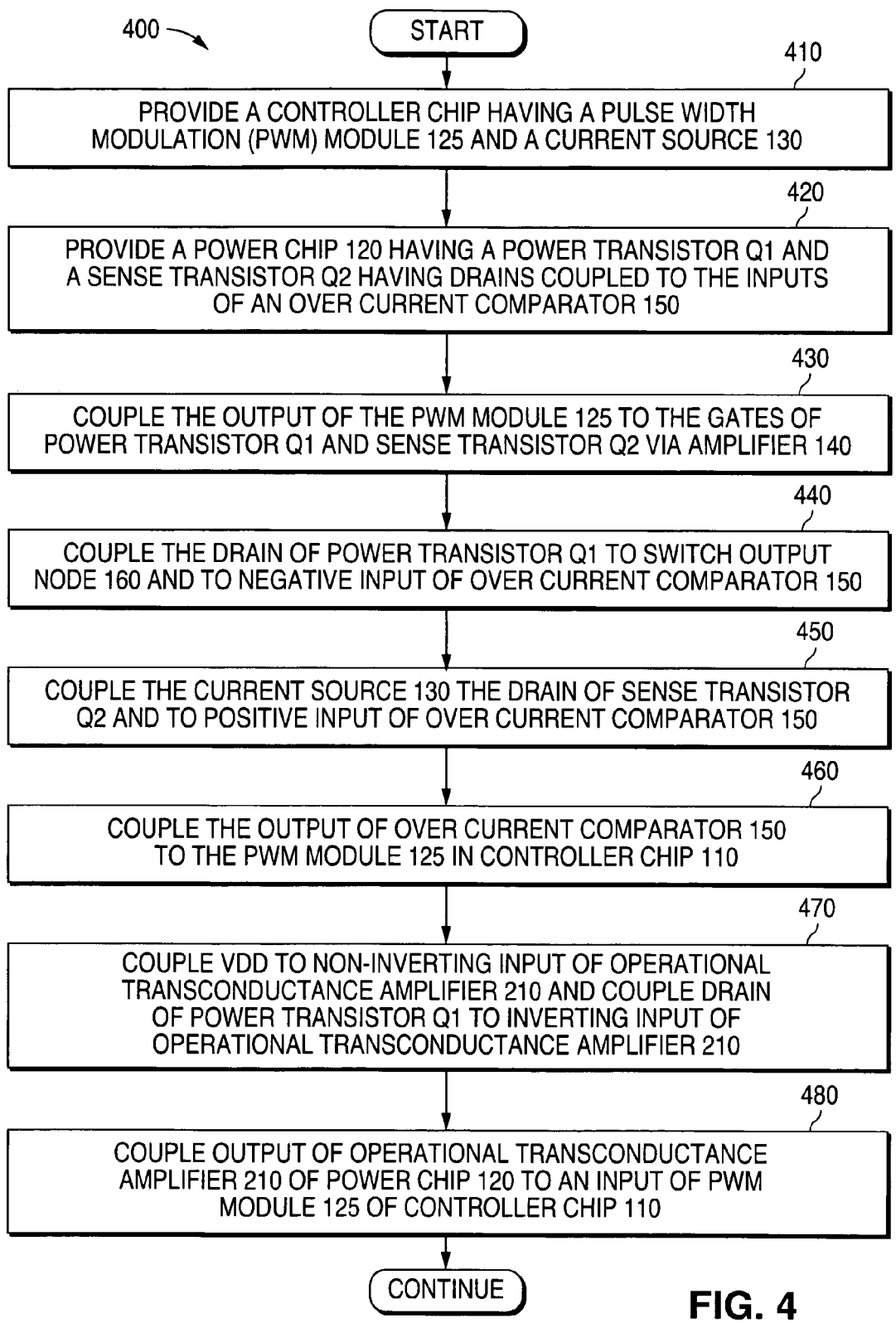
FIG. 4 illustrates a flow chart showing the steps of a method for forming an advantageous embodiment of the invention.

FIG. 4 illustrates a flow chart 400 showing the steps of a method for forming an advantageous embodiment of the invention. In the first step of the method a controller chip is provided that has a pulse width modulation (PWM) module 125 and a reference current source (step 410). A power chip 120 is also provided that has a power transistor Q1 and a sense transistor Q2. The drain of the power transistor Q1 and the drain of the sense transistor Q2 are each connected to an input of an over current comparator 150 (step 420).

The output of PWM module 125 in controller chip 110 is coupled though an amplifier 140 in the power chip 120 to the gate of the power transistor Q1 and to the gate of the sense transistor Q2 in power chip 120 (step 420). The drain of the power transistor Q1 is coupled to the switch output node 150 of the power chip 120 and to the negative input of the over current comparator 150 (step 440). The drain of the sense transistor Q2 is coupled to the reference current source 130 in the controller chip 110 and to the positive input of the over current comparator 150 (step 450).

The output of the over current comparator 150 is coupled to the PWM module 125 in the controller chip 110 (step 460). The integrated circuit power supply "vdd" is coupled to a non-inverting input of an operational transconductance amplifier circuit 210 in the power chip 120. The drain of the power transistor Q1 is coupled to an inverting input of the operational transconductance amplifier circuit 210 (step 470). The output of operational transconductance amplifier circuit 210 of the power chip 120 is coupled to an input of the PWM module 125 of the controller chip 110 (step 480).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. An apparatus comprising:
    a pulse width modulation module in a controller chip, the pulse width modulation module configured to provide pulse width modulation signals to a power chip through a signal line that connects said controller chip to said power chip; and
    current flow status detection circuitry in said power chip, the current flow status detection circuitry configured to detect a current flow status in said power chip and to provide to said pulse width modulation module a current flow status signal that is indicative of said current flow status;
    wherein said pulse width modulation module is further configured to modify the pulse width modulation signals depending on a value of said current flow status signal; and
    wherein the power chip is configured to produce an output current at an output node based on the pulse width modulation signals.

2. The apparatus as set forth in claim 1, wherein said current flow status in said power chip comprises an over-current conditions and said current flow status signal comprises an over-current protection signal.

3. The apparatus as set forth in claim 1, wherein said current flow status detection circuitry comprises an over-current comparator circuit having an output coupled to said pulse width modulation module.

4. The apparatus as set forth in claim 3, further comprising:
    a reference current source configured to provide a reference current to (i) a sense transistor of said power chip and (ii) a first input of said over-current comparator circuit.

5. The apparatus as set forth in claim 4, wherein:
    the sense transistor has a gate coupled to a gate of a power transistor; and
    a second input of the over-current comparator circuit is coupled to the power transistor.

6. The apparatus as set forth in claim 1, wherein said current flow status in said power chip comprises a status of the output current at the output node of said power chips and said current flow status signal comprises a signal that is a scaled replica of said output current.

7. The apparatus as set forth in claim 6, wherein said current flow status detection circuitry comprises an operational transconductance amplifier circuit having an output coupled to an input of said pulse width modulation module.

8. The apparatus as set forth in claim 1, wherein said controller chip and said power chip are located on a die attach pad of an integrated circuit device.

9. An apparatus comprising a power chip, the power chip comprising:
    an input node configured to be coupled to a pulse width modulation module in a controller chip, the input node configured to receive pulse width modulation signals from the pulse width modulation module through a signal line that connects said controller chip to said power chip;
    current flow status detection circuitry configured to detect a current flow status in said power chip and to provide to said pulse width modulation module a current flow status signal that is indicative of said current flow status; and
    circuitry configured to produce an output current at an output node based on the pulse width modulation signals;
    wherein the input node is further configured to receive from said pulse width modulation module modified pulse width modulation control signals depending on a value of said current flow status signal.

10. The apparatus as set forth in claim 9, wherein said current flow status in said power chip comprises an over-current conditions and said current flow status signal comprises an over-current protection signal.

11. The apparatus as set forth in claim 9, wherein said current flow status detection circuitry comprises an over-current comparator circuit having an output coupled to a second output node, the second output node configured to be coupled to said pulse width modulation module.

12. The apparatus as set forth in claim 11, further comprising:
   a second input node configured to be coupled to a reference current source, the second input node configured to receive a reference current from the reference current source and to provide the reference current to (i) a sense transistor of said power chip and (ii) a first input of said over-current comparator circuit.

13. The apparatus as set forth in claim 12, wherein:
   the sense transistor has a gate coupled to a gate of a power transistor; and
   a second input of the over-current comparator circuit is coupled to the power transistor.

14. The apparatus as set forth in claim 9, wherein said current flow status in said power chip comprises a status of the output current at a the output node of said power chip, and said current flow status signal comprises a signal that is a scaled replica of said output current.

15. The apparatus as set forth in claim 14, wherein said current flow status detection circuitry comprises an operational transconductance amplifier circuit having an output coupled to a second output node, the second output node configured to be coupled to an input of said pulse width modulation module.

16. The apparatus as set forth in claim 9, wherein said controller chip and said power switch chip are located on a die attach pad of a switch mode power supply integrated circuit.

17. A switch mode power supply integrated comprising:
   a power chip; and
   a controller chip that comprises a pulse width modulation module configured to provide pulse width modulation signals to said power chip through a signal line that connects said controller chip to said power chip;
   wherein said power chip comprises current flow status detection circuitry configured to detect a current flow status in said power chip and to provide to said pulse width modulation module a current flow status signal that is indicative of said current flow status;
   wherein said pulse width modulation module is further configured to modify the pulse width modulation signals depending on a value of said current flow status signal; and
   wherein the power chip is configured to produce an output current at an output node based on the pulse width modulation signals.

18. The switch mode power supply integrated circuit as set forth in claim 17, wherein said current flow status detection circuitry comprises at least one of: an over-current comparator circuit and an operational transconductance amplifier.

19. The switch mode power supply integrated circuit as set forth in claim 18, wherein:
   the current flow status detection circuitry comprises the over-current comparator circuit; and
   said controller chip further comprises a reference current source configured to provide a reference current signal to (i) a sense transistor of said power chip and (ii) a first input of the over-current comparator circuit.

20. The switch mode power supply integrated circuit as set forth in claim 17, wherein said power chip is configured to provide to said pulse width modulation module a signal that represents a scaled replica of the output current at the output node of said power chip.

* * * * *

UNITED STATES PATENT AND TRADEMARK OFFICE
CERTIFICATE OF CORRECTION

| | | |
|---|---|---|
| PATENT NO. | : 7,642,842 B1 | Page 1 of 1 |
| APPLICATION NO. | : 11/356708 | |
| DATED | : January 5, 2010 | |
| INVENTOR(S) | : Gregory J. Smith et al. | |

It is certified that error appears in the above-identified patent and that said Letters Patent is hereby corrected as shown below:

Column 6, claim 2, line 10, delete "conditions" and replace with --condition,--;

Column 6, claim 6, line 28, delete "chips" and replace with --chip,--;

Column 6, claim 9, line 57, delete "control"; and

Column 6, claim 10, line 61, delete "conditions" and replace with --condition,--.

Signed and Sealed this
Twenty-second Day of February, 2011

David J. Kappos
*Director of the United States Patent and Trademark Office*